United States Patent [19]

Kuroki

[11] Patent Number: 4,489,279
[45] Date of Patent: Dec. 18, 1984

[54] VARIABLE-FREQUENCY OSCILLATOR HAVING A CRYSTAL OSCILLATOR

[75] Inventor: Kazuo Kuroki, Tokyo, Japan

[73] Assignee: Fuji Electric Company, Ltd., Kawasaki, Japan

[21] Appl. No.: 413,775

[22] Filed: Sep. 1, 1982

[30] Foreign Application Priority Data

Oct. 20, 1981 [JP] Japan .................. 56-167618

[51] Int. Cl.³ ............ H03K 3/72; H03K 3/037; H03L 7/18
[52] U.S. Cl. .................. 328/134; 307/526; 307/529; 307/271; 328/16; 328/63
[58] Field of Search .............. 307/525-527, 307/529, 271; 328/15, 16, 19, 58, 63, 133, 134, 120; 331/46, 48

[56] References Cited

U.S. PATENT DOCUMENTS

| | | | |
|---|---|---|---|
| 4,092,604 | 5/1978 | Berney | 307/271 X |
| 4,360,788 | 11/1982 | Erps et al. | 307/271 X |
| 4,388,596 | 6/1983 | Yamashita | 328/134 X |
| 4,427,952 | 1/1984 | Zumsteg | 331/46 X |

OTHER PUBLICATIONS

Kroupa, "Pulse Subtractor for Frequency Synthesis", Electronic Engineering, Jan. 1977, p. 25.

Primary Examiner—Stanley D. Miller
Assistant Examiner—David R. Hudspeth
Attorney, Agent, or Firm—Brumbaugh, Graves, Donohue & Raymond

[57] ABSTRACT

A highly stable, tunable oscillator circuit includes a crystal oscillator providing a reference pulse signal of frequency Fco, a voltage-to-frequency converter responsive to a control voltage for providing a control pulse signal of frequency Fv substantially lower than Fco, a toggle circuit receiving the reference signal and providing a first and a second complementary signals, each having a frequency Fco/2 and the same pulse-width as the reference signal, a flip-flop circuit receiving the reference signal, the control signal and the first complementary signal and providing a pulse signal having frequency Fv and a pulse-width equal to the period of the reference signal, and synchronized with the first and second complementary signals. The signal provided by the flip-flop circuit is logically combined with the first complementary signal in and AND gate. The output of the AND gate is then logically combined with the second complementary signal in an OR gate to derive a combined signal of frequency (Fco/2)+Fv. The combined signal is received by a frequency divider network which divides the frequency of the combined signal by an integer N and provides an output signal at a desired frequency. By selecting the frequencies of the reference, control and output signal such that Fco>>Fv>>Fo, a highly stable, smoothly tunable output signal is obtained.

3 Claims, 3 Drawing Figures

VARIABLE-FREQUENCY OSCILLATOR HAVING A CRYSTAL OSCILLATOR

BACKGROUND OF THE INVENTION

In a case where inverters are operated in synchronization with a commercial power source or where a plurality of inverters are operated in parallel, it is required to detect the phase difference and control the output frequency of the inverters for about several % in order to align the output frequencies and the output voltage phases to each other. For the above purpose, an oscillator for use in the inverters of this type has to be equipped with a frequency-varying function. Further, since the oscillator is operated alone in a case where the commercial power source is interrupted or the like, the accuracy for the output frequency of the device is determined by the accuracy for the frequency from the oscillator.

Generally, since an extremely high accuracy is required for the output frequency in the case of a constant voltage constant frequency inverter, fluctuations including temperature changes and aging changes have to be restricted to less than 0.1%. Thus, it is required for the oscillator that, if the frequency control value is zero or a certain value, the frequency accuracy has to determine the value.

In addition, since the constant voltage constant frequency inverter is often used in a not-interrupted type power source system, it is required that the inverter is highly reliable and stable, includes less number of components and less number of controlling factors.

A circuit structure as shown in FIG. 1 has been known as a variable-frequency oscillator of a high stability using a crystal oscillator. In the circuit shown in FIG. 1, the output frequency Fco from a crystal oscillator 1 is converted into a voltage Vco in a frequency-voltage converter 2 and then introduced into an adder 3. While on the other hand, a control voltge Vc is also introduced to the adder 3 and the input value Vco and the control voltage Vc form a setting value for determining the output frequency. While on the other hand, the output from the adder 3 is supplied by way of a PI controller 4 to a voltage-frequency converter 5 and converted into a pulse signal having frequency N×Fo. The signal is frequency-divided to 1/N in a frequency divider 7 into an output signal having frequency Fo and, at the same time, converted by a frequency-voltage converter 6 into a voltage VN×Fo and fed back to the adder 3. In such a structure, the output from the adder 3 is the difference between Vc+Vco and VN×Fo. By controlling the difference to zero in the PI controller, the output frequency N×Fo from the voltage-frequency converter 5 is described as: Fco+(frequency Fc determined by control voltage Vc), providing that the gain and the linearity of the frequency-voltage converters 5 and 6 are same.

In this system, the accuracy for the output frequency Fo is determined by the accuracy for the frequency-voltage converters 2 and 6. Accordingly, it is required for the frequency-voltage converters 2 and 6 that they have the same gain and the linearity as well as highly accurate and stable. However, since the frequency-voltage converter is generally composed by using resistors, capacitors, diodes, differential amplifiers and the likes, the circuit structure is complicated very much, as well as a lot of controlling sections are required, to bring about problems in view of the reliability and stability and cause great troubles in the size of the apparatus and the cost, in order to satisfy the foregoing performances.

Further, since the output voltage N×Fo from the voltage-frequency converter 5 is used while divided by the frequency divider into a lower frequency, a voltage-frequency converter of a frequency as high as several MHz is required for the digital control or the like, thereby making the device very much expensive.

SUMMARY OF THE INVENTION

The object of this invention is to eliminate the foregoing drawbacks and provide a highly accurate, stable and reliable variable-frequency oscillator in a small size and at a reduced cost.

In this invention, an output signal is obtained by selecting the output frequency Fv from a voltage-frequency converter inputted with a control voltage sufficiently lower than the output frequency Fco from a crystal oscillator, dividing the output pulses from the crystal oscillator alternately to obtain two trains of pulses having a frequency of Fco/2, picking up Fv pulses during unit interval of time from one of the two pulse trains in response to the output pulses from the voltage-frequency converter, combining the picked up pulses with the other pulse train to generate (Fco/2+Fv) pulses per unit interval of time and dividing the pulses thus generated. The frequency for the output signal is varied by varying Fv to thereby vary the number of pulse synthesis per unit interval of time. Since the synthesized pulse are taken out from one of the two pulse trains divided from the output pulses from the crystal oscillator, they do not overlap with the pulses in another pulse train.

DETAILED DESCRIPTION

This invention is to be explained by way of its embodiment.

Figure 1:
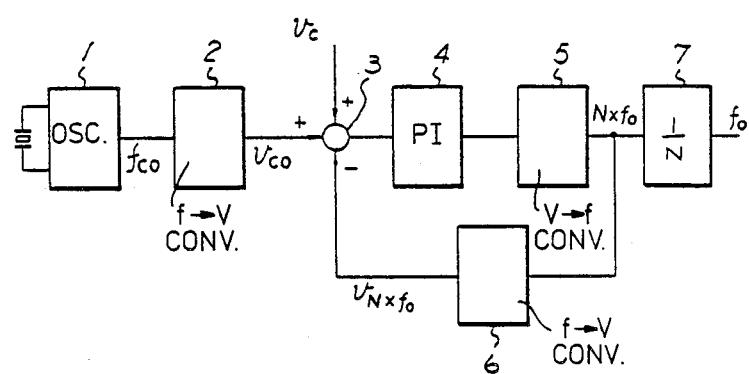
FIG. 1 is a schematic block diagram of a known variable-frequency oscillator circuit.
Figure 2:
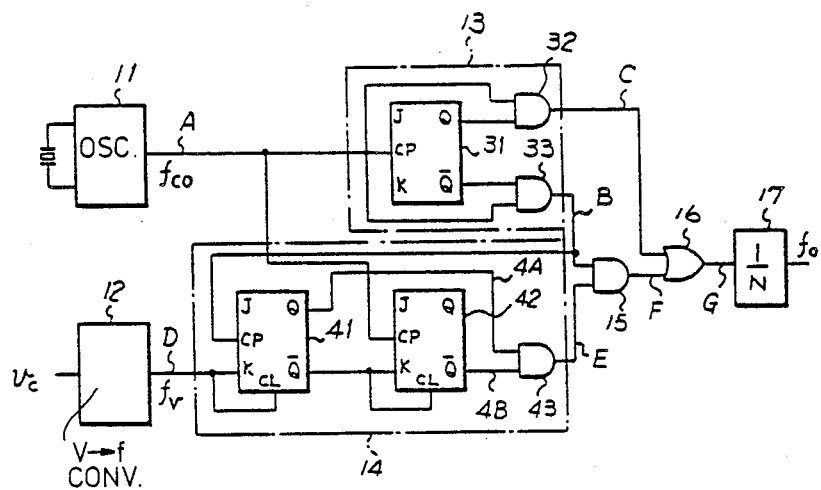
FIG. 2 is a schematic block diagram of a variable-frequency oscillator circuit according to an embodiment of the present invention.

FIG. 2 shows one embodiment of this invention.

In FIG. 2, the output from a crystal oscillator 11 is inputted into logic circuits 13 and 14, and the output from a voltage-frequency converter 12 inputted with a control voltage Vc is inputted to the logic circuit 14. One of the outputs from the logic circuit 13 and the output from the logic circuit 14 are inputted to an AND gate 15, and the output from the AND gate 15 and the other output from the logic circuit 13 are inputted into an OR gate 16, the output G of which is outputted by way of a frequency divider 17. The logic circuit 13 is composed of a J-K flip-flop 31 and NAND gates 32 and 33 and the circuit has a function of dividing the output from the crystal oscillator 11 into two trains of pulses having a frequency Fco/2. The logic circuit 14 is composed of J-K flip-flops 41, 42 and an AND gate 43 and the circuit has the function of generating synthesized instruction pulses in response to the output from the voltage-frequency converter 12 and the output from the crystal oscillator 1. The logic circuit 13 can be referred to as a first circuit device that divides the output pulses from the crystal oscillator alternately into two trains of pulses, while the logic circuit 14 and the AND gate 15 can be referred to as a second circuit device that picks up Fv pulses per unit time interval from one of the pulse trains in response to the output fom the converter 12.

Figure 3:
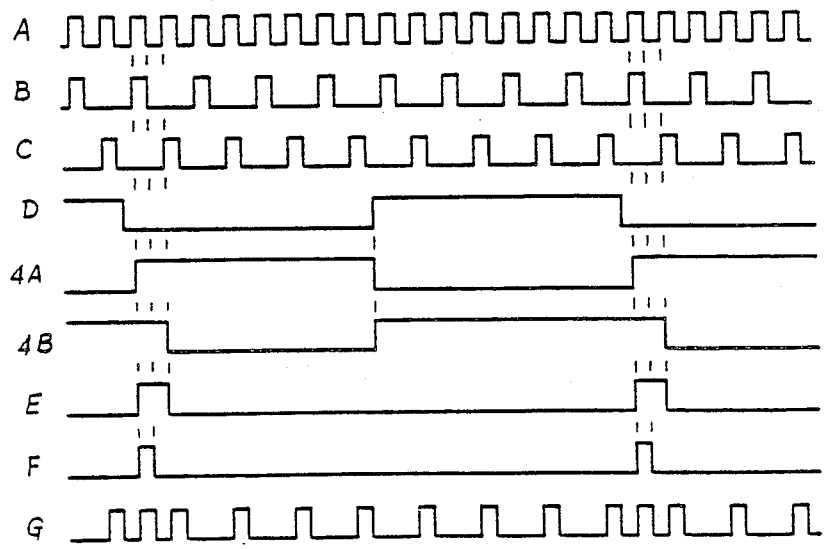

Now assuming in such a structure that the output frequency from the crystal oscillator 11 is Fco and the center frequency for the voltage-frequency converter 12 (a frequency determined by the control voltage Vc where the control voltage Fc is varied for $\pm\Delta$Vc and the output frequency Fo is varied for required variable frequency $\pm\Delta$Fo) is Fv, and that Fv is selected sufficiently lower than Fco, pulse waveforms appearing on the lines shown by (A)-(G) in FIG. 2 can be represented respectively by (A)-(G) in FIG. 3. The output pulse A from the crystal oscillator 11 is divided into two trains of pulses B and C, in which one pulse train B is inputted to the AND gate 15 and the other pulse train C is inputted into the OR gate 16. While on the other hand, the output signal D from the voltage-frequency converter 12 is synchronized with the rising point of the signal A and further shaped into an inverted signal 4A in the J-K flip-flop 41. The signal 4A is further delayed with its rising point by one cycle of the signal A and formed in the J-K flip-flop 42 into an inverted signal 4B, which is formed through the AND gate 43 into a signal E. The signals B and E thus obtained are inputted into the AND gate 15 to obtain a signal F as the output of the gate. Further, the signal F and signal C are inputted to the OR gate 16 and, as the result, a signal G is obtained. The signal G is frequency-divided to 1/N in a frequency divider 17 into a final output signal.

In the circuit structure shown in FIG. 2, the relation for each of the frequencies is described as:

$$Fo \simeq 1/N \left( \frac{Fco}{2} + Fv \right)$$

and the output frequency is varied by the unit of (2/Fco) sec by varying the output frequency Fv from the voltage-frequency converter 12. In the case of a constant voltage constant frequency converter, since the frequency ((Fco/2)+Fv) of the signal G is generally higher sufficiently than the output frequency Fo (50 Hz or 60 Hz) and each of the frequencies can be selected under the condition of: Fco>>Fv>>Fo, the output frequency can be varied smoothly.

The accuracy for the output frequency is expressed as:

(accuracy for voltage-frequency converter 12) $\times$ $$\frac{\frac{1}{N} Fv}{\frac{1}{N}\left( \frac{Fco}{2} + Fv \right)} =$$

(accuracy for voltage-frequency converter 12) $\times \frac{2Fv}{Fco + 2Fv}$.

providing that the consideration for the accuracy of the crystal oscillator is neglisible.

Where output frequency Fo=50 Hz, variable frequency = $\pm 2\%$ and N=$2^8 \times 96$, for instance, since it is only required that the frequency variable range of the voltage-frequency converter is greater than $\pm 24.6$ KHz, if the frequency Fco of the crystal oscillator 11 is selected to 2.3 MHz, the center frequency Fv for the voltage-frequency is 78.8 KHz and the accuracy for the output frequency is (accuracy of voltage-frequency converter)$\times 0.064$.

Since counters, J-K flip-flops and the likes are used in an actual circuit for the frequency divider 17 described as above, the signal G can be used directly as the clock signal in the control circuit.

According to this invention, since a variable output frequency can be obtained by selecting the output frequency Fv from the voltage-frequency converter sufficiently lower than the output frequency Fco from the crystal oscillator, preparing a pulse train having a frequency ((Fco/2)+Fv) in a simple digital circuit and frequency-dividing the pulse train, advantages can be obtained as described below.

(1) A high accuracy can be obtained with ease for the output frequency without using a voltage-frequency converter of high accuracy.

(2) Since a voltage-frequency converter of lower frequency can be used even in a digital circuit operated at a higher frequency, the device cost can be reduced.

(3) Since the error in the output frequency is determined depending on the value of $$1/N \left( \frac{2Fv}{Fco + 2Fv} \right).$$

error in the frequency of the crystal oscillator can easily be absorbed by merely providing the voltage-frequency converter with a controlling function for the center frequency, which enabling the use of an inexpensive crystal oscillator.

(4) The output frequency can be controlled by merely controlling the center frequency for the voltage-frequency converter, which makes the operation highly stable.

(5) Since all of the components other than the voltage-frequency converter are composed as digital circuits, they are highly stable without undergoing effects such as of temperature changes and aging changes.

(6) Since less number of parts are required, the device can be manufactured small in size at low cost with high reliability.

In addition to the constant voltage constant frequency inverter as described above, this invention can be applied to an oscillator for use in the control circuit for a variable frequency inverter as well.

I claim:

1. A variable-frequency oscillator circuit comprising: a reference oscillator providing a reference pulse signal at a frequency fc; voltage-to-frequency converter means responsive to a control voltage for providing a control pulse signal at a frequency fv substantially lower than fc, first logic means responsive to the reference signal for providing first and second pulse signals each having frequency fc/2 and each being the complement of the other; second logic means responsive to the control signal, the reference signal and the first signal for providing a third pulse signal having a frequency substantially equal to fv and a pulse-width substantially equal to 1/fc, and synchronized with the first and second signals; third logic means responsive to the first, second and third signals for providing a fourth pulse signal which is substantially the same as the second signal but having a pulse periodically added at intervals of 1/fv; and frequency divider means responsive to the fourth signal for dividing the frequency of the fourth signal by an integral amount to provide an output signal of a desired frequency.

2. A variable-frequency oscillator circuit as recited in claim 1 wherein the first logic means comprises a first flip-flop having at least a clock input, a normal output and an inverted output and being adapted to toggle, and means coupling the reference signal to clock input of the first flip-flop; the second logic means comprises second and third flip-flops each having at least a clock input, a logic input, a normal output and an inverted output, first gating means coupled to the normal output of the second flip-flop and the inverted output of the third flip-flop for performing the AND logic function and providing the third signal, means coupling the control signal to the logic input of the second flip-flop, means coupling the reference signal to the clock input of the third flip-flop, means coupling the inverted output of the second flip-flop to the logic input of the third flip-flop and means coupling the first signal to the clock input of the second flip-flop; and the third logic means comprises second gating means coupled to receive the first and third signals for performing the AND logic function and providing a fifth signal, and third gating means coupled to receive the second signal and the fifth signal for performing the OR logic function and providing the fourth signal.

3. A variable-frequency oscillator circuit as recited in claim 2 wherein the first flip-flop is a JK flip-flop having a clock input, J and K logic inputs, a normal output and an inverted output; the first logic means further comprises a first two-input AND gate having one input coupled to receive the reference signal and the other input coupled to the normal output of the first flip-flop and a second two-input AND gate having one input coupled to receive the reference signal and the other input coupled to the inverted output of the first flip-flop; the second and third flip-flops are JK flip-flops each having a clock input, J and K logic inputs, an asynchronous clear input, a normal output and an inverted output; the first gating means comprises a two-input NAND gate having one input coupled to the normal output of the second flip-flop and the other input coupled to the inverted output of the third flip-flop; the means coupling the control signal to the logic input of the second flip-flop comprises a connection between the voltage-to-frequency converter means and the K and clear inputs of the second flip-flop, the means coupling the inverted output of the second flip-flop to the logic input of the third flip-flop comprises a connection between the inverted output of the second flip-flop and the K and clear inputs of the third flip-flop; the second gating means comprises a fourth two-input AND gate having one input coupled to the output of the first AND gate and the other input coupled to the output of the third AND gate; and the third gating means comprises a two-input OR gate having one input coupled to the output of the second AND gate and the other input coupled to the output of the fourth AND gate.

* * * * *

UNITED STATES PATENT AND TRADEMARK OFFICE
CERTIFICATE OF CORRECTION

PATENT NO. : 4,489,279

DATED : December 18, 1984

INVENTOR(S) : Kazuo Kuroki

It is certified that error appears in the above-identified patent and that said Letters Patent is hereby corrected as shown below:

Column 1, line 39, "voltge" should read --voltage--;
Column 1, line 49, "VN" should read --$V_N$--;
Column 1, line 51, "VN" should read --$V_N^N$--.

Signed and Sealed this

Twentieth Day of August 1985

[SEAL]

Attest:

DONALD J. QUIGG

Attesting Officer    Acting Commissioner of Patents and Trademarks